United States Patent
Takei et al.

(10) Patent No.: US 6,381,258 B1
(45) Date of Patent: Apr. 30, 2002

(54) RIDGE-STRUCTURE DFB SEMICONDUCTOR LASER AND METHOD OF MANUFACTURING THE SAME

(75) Inventors: Kiyoshi Takei; Nong Chen; Yoshiaki Watanabe; Kiyofumi Chikuma, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/481,940

(22) Filed: Jan. 13, 2000

(30) Foreign Application Priority Data

Jan. 25, 1999 (JP) .............................. 11-015455

(51) Int. Cl.[7] .............................. H01S 3/08; H01S 5/00
(52) U.S. Cl. .......................................... 372/96; 372/46
(58) Field of Search ........................... 372/96, 45, 46, 372/50, 99, 102

(56) References Cited

U.S. PATENT DOCUMENTS

| | | | |
|---|---|---|---|
| 4,761,791 A | * 8/1988 | Stegmuller | 372/46 |
| 5,255,278 A | * 10/1993 | Yamanaka | 372/45 |
| 5,568,504 A | * 10/1996 | Kock et al. | 372/96 |
| 5,727,013 A | * 3/1998 | Botez et al. | 372/96 |
| 5,901,168 A | * 5/1999 | Baillargeon et al. | 372/96 |
| 6,026,110 A | * 2/2000 | Makino | 372/96 |

FOREIGN PATENT DOCUMENTS

JP          58-140111 A    *  8/1983

* cited by examiner

*Primary Examiner*—Quyen Leung
(74) *Attorney, Agent, or Firm*—Sughrue Mion, PLLC

(57) ABSTRACT

A description is provided of a ridge-structure DFB semiconductor laser and a method of manufacturing the laser wherein an optical absorption loss by a metal electrode formed on a grating can be avoided. The DFB semiconductor laser includes: a ridge protruding from flat portions of a cladding layer which is formed on an active layer, the ridge includes a cladding layer and a contact layer sequentially formed on the active layer; a plurality of metal strips having a predetermined periodicity along a longitudinal direction of the ridge and extending from a surface of at least one of the flat portions to a top of the ridge; and an insulating layer formed on the plurality of metal strips at the top of the ridge.

8 Claims, 7 Drawing Sheets

RIDGE-STRUCTURE DFB SEMICONDUCTOR LASER AND METHOD OF MANUFACTURING THE SAME

BACKGROUND OF THE INVENTION

1. Field of the Invention

The present invention relates to a distributed feedback (DFB) semiconductor laser and a method of manufacturing the same.

2. Related Background Art

A distributed feedback (DFB) semiconductor laser is used as a light source for an optical pickup device in an optical recording/reproducing apparatus in which an information signal is recorded/reproduced on/from an optical disc. The DFB semiconductor lasers are known as devices which can be applied in the fields of optical communications systems such as optical CATVs, pumping light sources for small solid-state lasers or second harmonic generation (SHG) short-wavelength lasers for high-density information recording, and optical measurement systems.

Electrons and holes as well as emitted lightwaves in the semiconductor laser should be confined within a small region of the semiconductor in order to obtain a transverse single-mode oscillation and low power operation. For this purpose, generally, a so-called double-heterostructure (DH structure) is employed in a direction perpendicular to the pn-junction of the semiconductor laser. With regard to a horizontal direction, a gain-guided or an index-guided structure is commonly used as a waveguide. The index-guided structure has a configuration in which an emission region of the laser is surrounded by a cladding material with a low refractive index in the horizontal direction as well as in the direction perpendicular to the pn-junction of the semiconductor laser. The index-guided structure can be realized in a laser with the emission region, for example, in a ridge in the form a stripe.

The ridge in the form of a stripe (hereinafter, simply referred to as a ridge) is formed by etching off the portion of a cladding layer other than a current injection region. Confinement of a lightwave can be attained in the ridge structure laser, since the effective refractive index for the lightwave propagating in a guide layer beneath the ridge is greater than the other portion. The ridge structure laser can be oscillated by injecting a current from an electrode provided on the top of the ridge to a substrate.

A surface grating DFB laser having an asymmetric cladding waveguide structure is proposed, as described in IEEE Photonics Technology Letters, Vol.9, No.11, November 1997, pp.1460–1462.

FIG. 1 is a schematic cross-sectional view of an asymmetric cladding DFB laser. The asymmetric cladding DFB laser has the following features.

First, the asymmetric cladding DFB laser is provided with cladding layers 1, 3 and an active layer 2 which is sandwiched between the cladding layers 1 and 3. The thickness of the upper cladding layer 3 is made smaller than that of the lower cladding layer 1 (i.e., an asymmetric cladding layer structure), so that the intensity of the optical field becomes asymmetric with regard to the direction perpendicular to the waveguide as indicated by a dashed line.

Second, the optical field of the laser emission penetrates into the grating region, since the upper cladding layer 3 is thinner than the lower cladding layer 1. The grating region includes insulating segments 6, which are periodically placed on the upper cladding layer 3, and a metal electrode 7. The insulating segments 6 and the metal electrode 7 may be made of $SiO_2$ and Ti—Pt—Au, respectively. Therefore, the emitted light is modulated by the grating to bring about a single-longitudinal-mode oscillation. The asymmetric cladding DFB laser is one of gain-coupled DFB lasers, since the optical absorption coefficients of the insulating segments 6 ($SiO_2$) and the metal electrode 7 (Ti—Pt—Au) are different.

As mentioned above, the optical absorption due to the metal electrode 7 is utilized in the asymmetric cladding DFB laser. On the other hand, the utilization of the optical absorption has the adverse effect of decreasing the slope efficiency (i.e., a gradient of output power versus injection current) of the laser. A region indicated by "A" in FIG. 1 shows an absorption region due to the metal electrode 7.

More particularly, the optical absorption by the metal below the top surface 6a of the insulating segments 6 is necessary for single-longitudinal-mode oscillation, while the optical absorption by the metal above the top surface 6a is unnecessary. The greater absorption within the grating region degrades the laser performance.

OBJECT AND SUMMARY OF THE INVENTION

The present invention is made in consideration of the above circumstances and it is an object of the present invention to provide a DFB semiconductor laser and a method of manufacturing the laser wherein an optical absorption loss by a metal electrode formed on a grating can be avoided.

According to the present invention, there is provided a method of manufacturing a ridge-structure DFB semiconductor laser, which includes the steps of: sequentially forming an active layer, a cladding layer and a contact layer on a substrate; partially removing the cladding layer and the contact layer to a predetermined depth to form flat portions and a ridge protruding from the flat portions; forming a plurality of metal strips having a predetermined periodicity along a longitudinal direction of the ridge and extending from a surface of at least one of the flat portions to a top of the ridge; forming an insulating layer on the plurality of metal strips, the at least one of the flat portions and the top of the ridge; removing a portion of the insulating layer on the at least one of the flat portions; and forming an electrode electrically connected to the plurality of metal strips.

According to another aspect of the present invention, the electrode is only formed on the at least one of the flat portions.

According to still another aspect of the present invention, the electrode is formed on the insulating layer so as to extend from the top of the ridge to the plurality of metal strips on the at least one of the flat portions.

According to further aspect of the present invention, the active layer is an $In_{1-x}Ga_xAs_{1-y}P_y$ ($0 \leq x \leq 1$, $0 \leq y \leq 1$) bulk layer or $In_{1-x}Ga_xAs_{1-y}P_y$ ($0 \leq x1$, $0 \leq y \leq 1$) single- or multiple-quantum-well layer, the cladding layer is an InP layer, and the contact layer is an $In_{1-y}Ga_xAs_{1-y}P_y$ ($0 \leq x \leq 1$, $0 \leq y \leq 1$) layer or an $In_{1-x}Ga_xAs$ ($0 \leq x \leq 1$) layer.

According to still further aspect of the present invention, the step of forming a plurality of metal strips includes the steps of: forming a metal film and subsequently a photoresist over the top of the ridge and the at least one of the flat portions, making a grating pattern of the photoresist having a predetermined periodicity along the longitudinal direction of the ridge, forming a plurality of metal strips having the predetermined periodicity and extending from a surface of at least one of the flat portions to a top of the ridge by using the grating pattern of the photoresist as a patterning mask.

According to another aspect of the present invention, the step of making a grating pattern includes the step of performing an electron-beam lithography.

According to the present invention, there is provided a ridge-structure DFB semiconductor laser, which includes: a ridge protruding from flat portions of cladding layer which is formed on an active layer, the ridge includes a cladding layer and a contact layer sequentially formed on the active layer; a plurality of metal strips having a predetermined periodicity along a longitudinal direction of the ridge and extending from a surface of at least one of the flat portions to a top of the ridge; and an insulating layer formed on the plurality of metal strips at the top of the ridge.

According to another aspect of the present invention, the laser further includes an electrode electrically connected to the plurality of metal strips.

According to still another aspect of the present invention, the electrode is only formed on the at least one of the flat portions.

According to further aspect of the present invention, the electrode is formed on the insulating layer so as to extend from the top of the ridge to the plurality of metal strips on the at least one of the flat portions.

According to still further aspect of the present invention, the active layer is an $In_xGa_xAs_{1-y}P_y$ (0x1, $0 \leq y \leq 1$) bulk layer or $In_{1-x}Ga_xAs_{1-y}P_y$ ($0 \leq x \leq 1$, $0 \leq y \leq 1$) single- or multiple-quantum-well layer, the cladding layer is an InP layer, and the contact layer is an $In_{1-x}Ga_xAs_{1-y}P_y$ ($0 \leq x \leq 1$, $0 \leq y \leq 1$) layer or an $In_{1-x}Ga_xAs$ ($0 \leq x \leq 1$) layer.

DETAILED DESCRIPTION OF THE PREFERRED EMBODIMENT

The embodiments according to the present invention will now be described in detail hereinbelow with reference to the drawings.

As described above, in the prior art ridge-structure DFB semiconductor lasers, the $SiO_2$ strips are embedded in the metal electrode to configure the grating. On the contrary, according to the present invention, metal strips are embedded in a dielectric material such as $SiO_2$.

Figure 1:
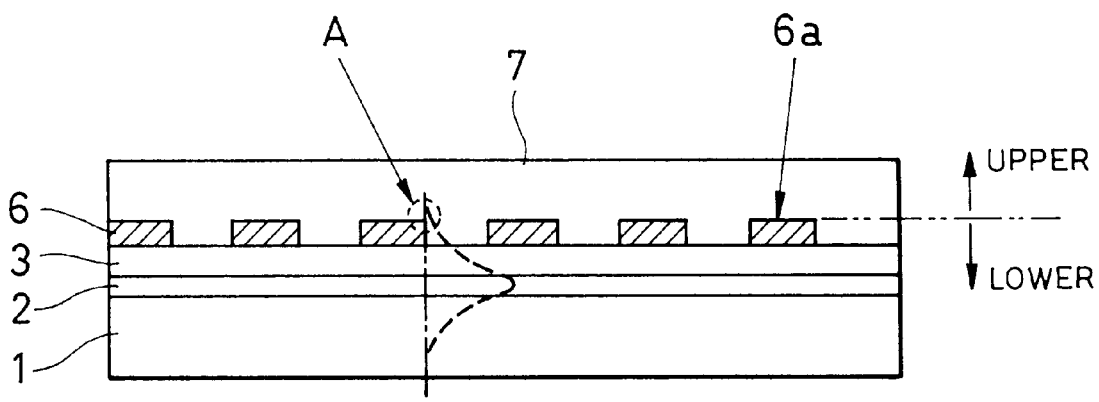
FIG. 1 is a schematic cross-sectional view of a prior art DFB semiconductor laser.
Figure 2:
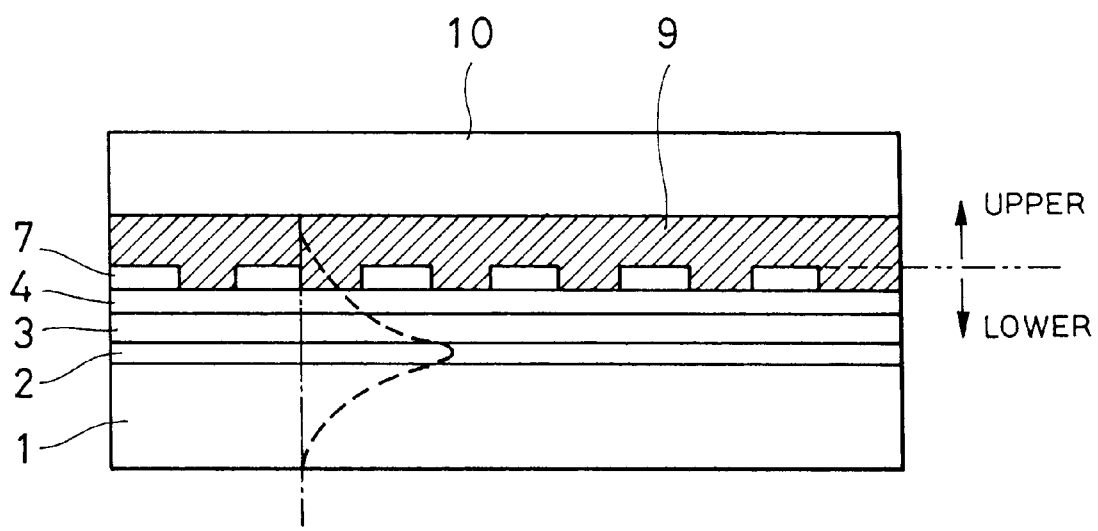
FIG. 2 is a schematic cross-sectional view of a DFB semiconductor laser according to an embodiment of the present invention.
Figure 8:
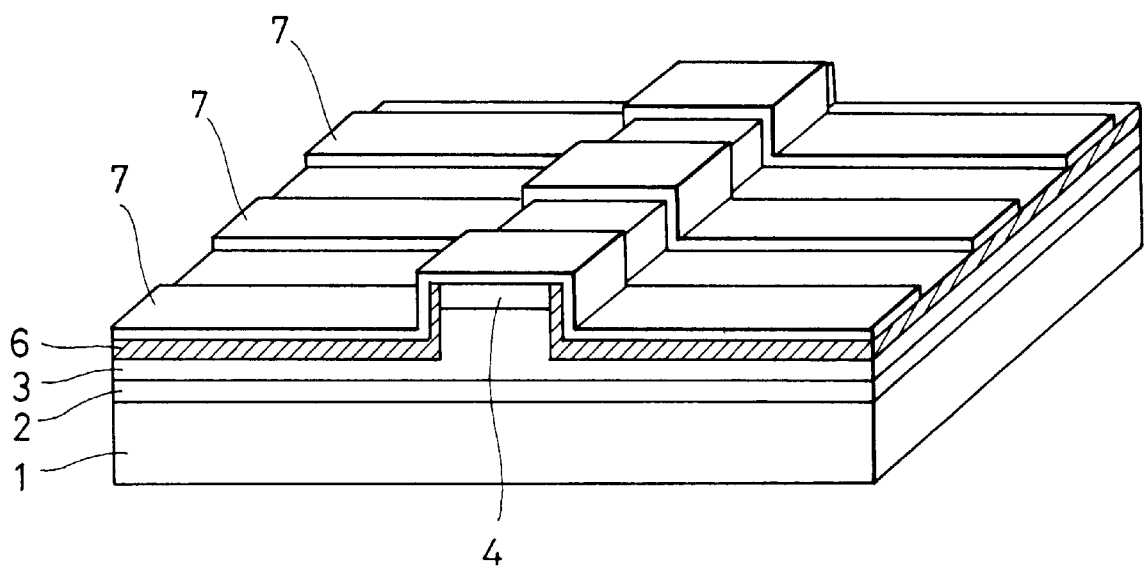
Figure 9:
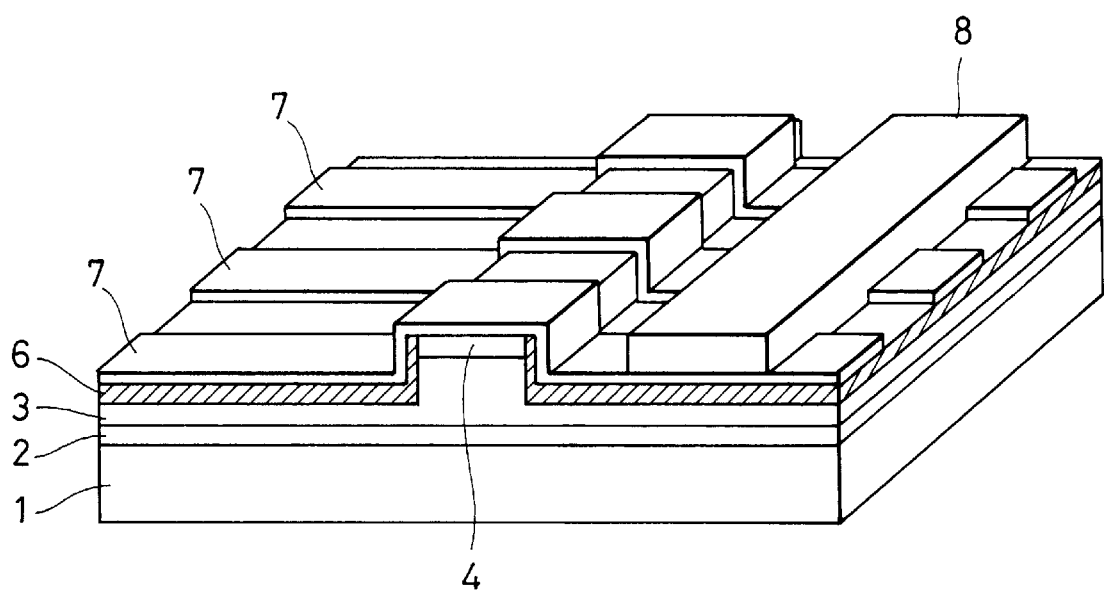

A ridge-structure DFB semiconductor laser according to one embodiment of the present invention is provided with a ridge formed above an active layer and a periodic structure placed along the longitudinal direction of the ridge, as shown in FIGS. 2 and 8. The ridge includes a cladding portion, which is projected from a cladding layer 3, and a contact layer 4 stacked on the cladding portion. A plurality of metal strips 7 are formed at regular intervals along the ridge to configure a grating. The metal strips 7 are extending over the ridge in a direction perpendicular to the ridge. The metal strips 7 are connected to the contact layer 4 and serves as electrodes for injecting an electric current to the active region.

A manufacturing method of a ridge-structure DFB semiconductor laser according to one embodiment of the present invention will be described hereinbelow with reference to FIGS. 3 to 13.

Figure 3:
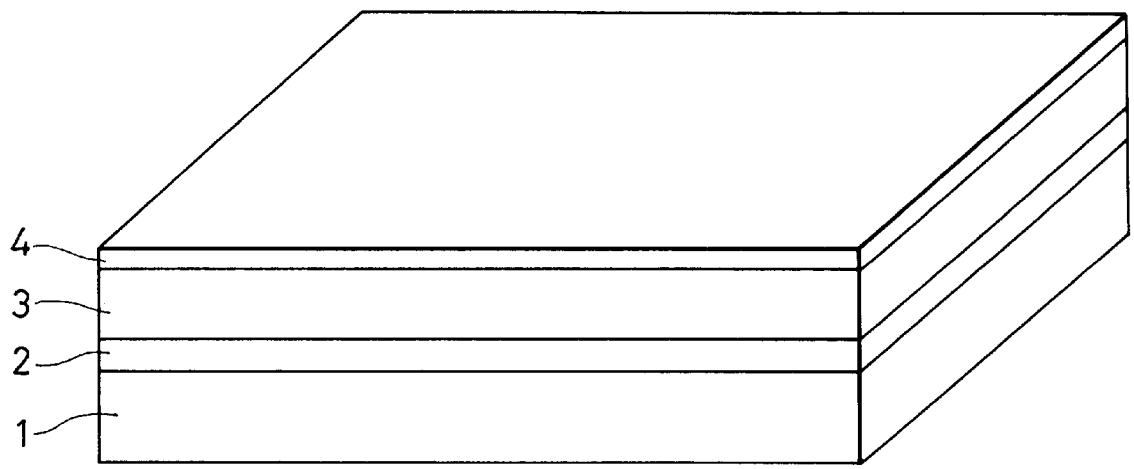
FIGS. 3 through 13 are schematic perspective views of a DFB semiconductor laser at manufacturing steps according to an embodiment of the present invention.

The ridge-structure DFB laser has an $In_{1-x}Ga_xAs_{1-y}P_y$ ($0 \leq x \leq 1$, $0 \leq y \leq 1$) active layer grown on an InP substrate. As shown in FIG. 3, a wafer for an InP substrate having a predetermined crystalline plane orientation is first prepared. The wafer surface is cleaned by chemical etching. A predetermined epitaxial growth technique is employed to grow a lower cladding layer 1, an InGaAsP active layer 2, an upper cladding layer 3, and a contact layer 4. The layers are grown in this order.

Various kinds of epitaxial growth techniques can be used such as a liquid phase epitaxy (LPE), a metal-organic chemical vapor deposition (MOCVD), or a molecular beam epitaxy (MBE). The active layer 2 may be configured as a bulk layer, a single-quantum-well (SQW) structure, or a multiple-quantum-well (MQW) structure.

For example, an n-InP lower cladding layer, an $In_{1-x}Ga_xAs_{1-y}P_y$ ($0 \leq x \leq 1$, $0 \leq y \leq 1$) active layer, a p-InP upper cladding layer, and a p-InGaAsP or p-InGaAs contact layer are grown on an n-InP substrate.

Figure 4:
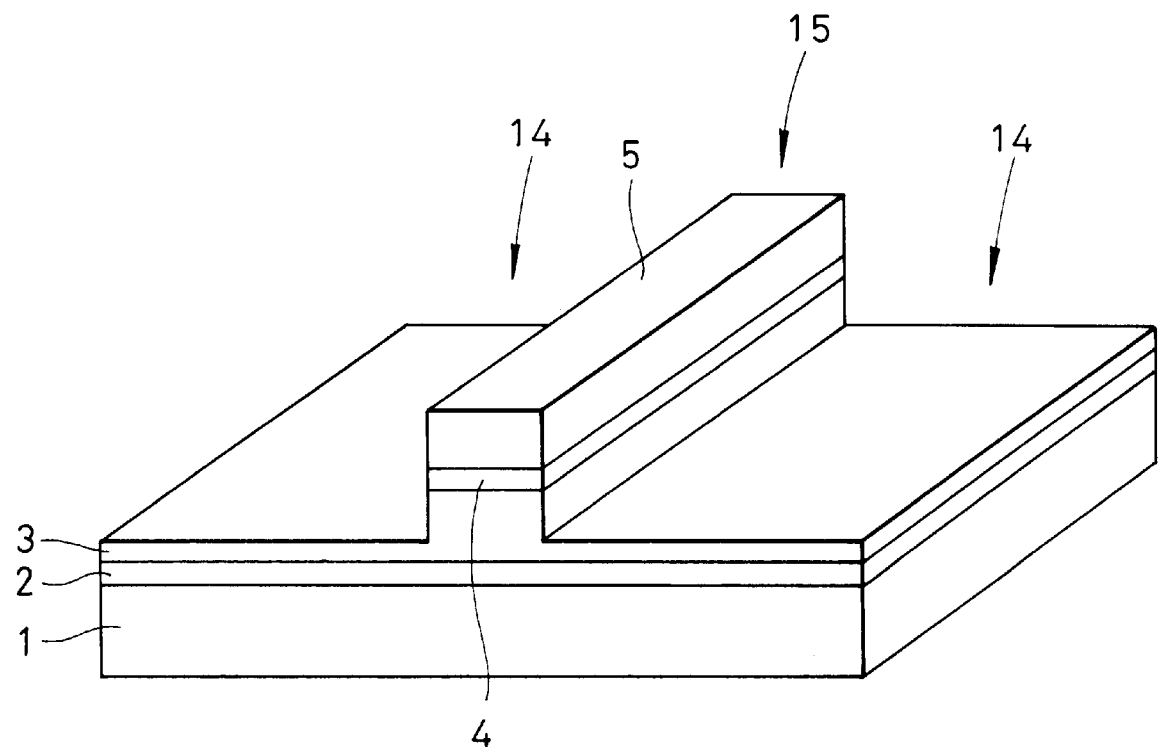

At a next process step, as shown in FIG. 4, a predetermined stripe mask 5 for defining a ridge is formed on the contact layer 4 so as to extend in the direction of a predetermined crystalline orientation. The stripe mask 5 may be made of a photoresist and can be formed by using, for example, a photolithography technique or the like. The contact layer 4 and the upper cladding layer 3 are, then, etched off to a predetermined depth. In this manner, two flat portions 14 and a ridge 15 are formed. The ridge 15 is protruding from the flat portions 14 with a predetermined height and has a flat surface on the top.

Figure 5:
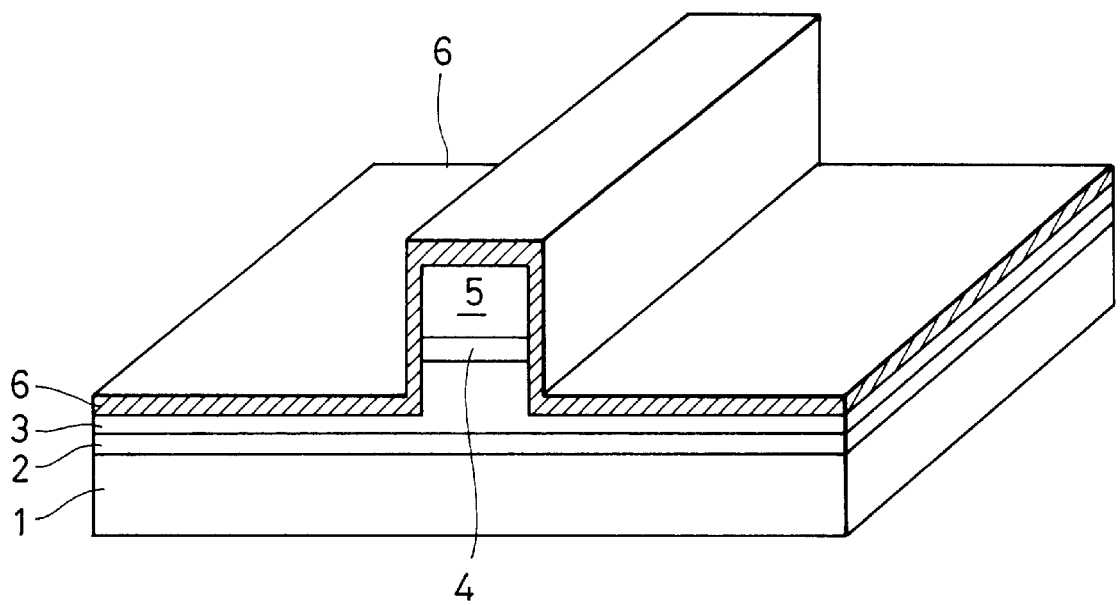

Then, an insulating film 6 made of $SiO_2$ is deposited by sputtering to cover both surfaces of the flat portions 14 and the ridge 15 as shown in FIG. 5.

Figure 6:
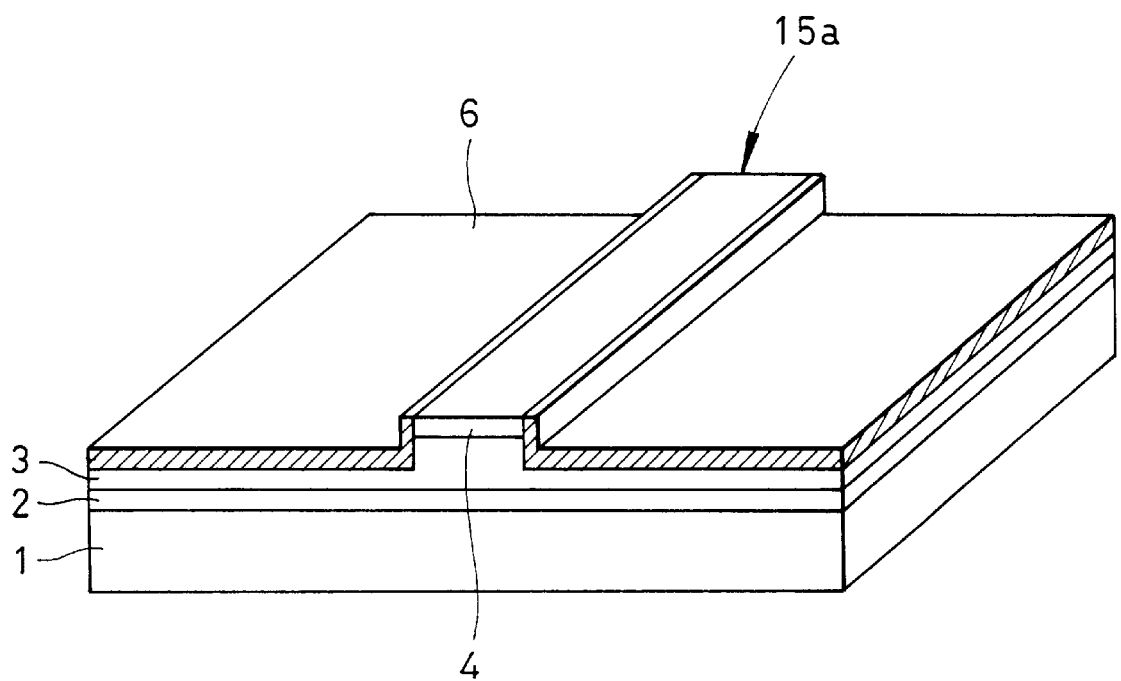
Figure 7:
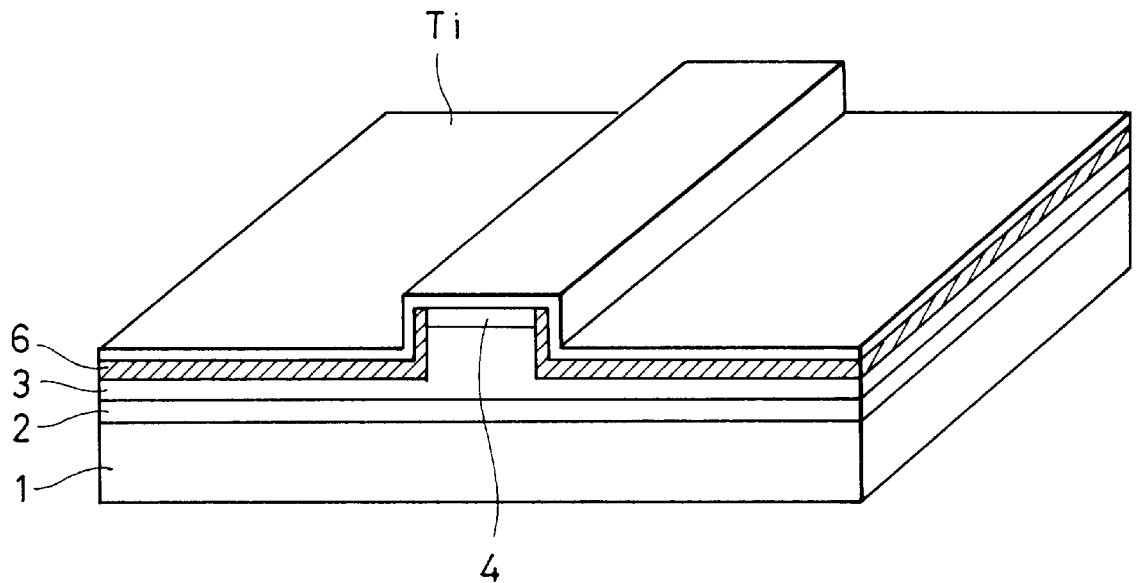

Next, the photoresist mask 5 is removed by a lift-off method to make the top surface of the ridge 15a exposed as shown in FIG. 6. Subsequently, a thin metal film made of, for example, Ti is plated all over the surface including the ridge surface 15a by a vapor deposition method as shown in FIG. 7.

Then, the Ti film is partially etched off by electron beam (EB) lithography to form a grating comprising a plurality of metal (Ti) strips 7. Consequently, as shown in FIG. 8, the metal strips 7 are formed with regular intervals of a predetermined periodicity (Λ) along the longitudinal direction of the ridge and extend over the ridge in a direction perpendicular to the ridge.

Generally, the DFB laser has a periodic structure with a periodicity Λ along the propagation direction of the emitted light. The refractive index for the lightwave propagating in a waveguide changes in accordance with the periodicity. The lightwave is reflected periodically and the reflection coefficient reaches a maximum value at a wavelength where the optical phases of the reflected lightwave coincide (Bragg reflection). A lasing oscillation occurs at the wavelength. In more detail, the oscillation wavelength of the DFB semiconductor laser is determined by the periodicity Λ. Thus a single-longitudinal-mode operation can be obtained under the condition which is given by Λ=mλ/2n, where "mm" is an integer, λ denotes an oscillation wavelength (in a vacuum), and "n" denotes an effective refractive index of a laser medium.

In the forming process of a grating, a metal (Ti) film and subsequently a photoresist layer are formed on the entire surface of the flat portions 14 and the ridge 15. The photoresist is, then, exposed employing an electron beam (EB) method so as to make a latent image of a grating having a predetermined periodicity along the longitudinal direction of the ridge 15. The photoresist is developed to yield a pattern of the grating. The metal strips 7 having the predetermined periodicity are formed over the surface including the flat portions and the ridge top by etching the metal film using the photoresist as a patterning mask.

Figure 10:
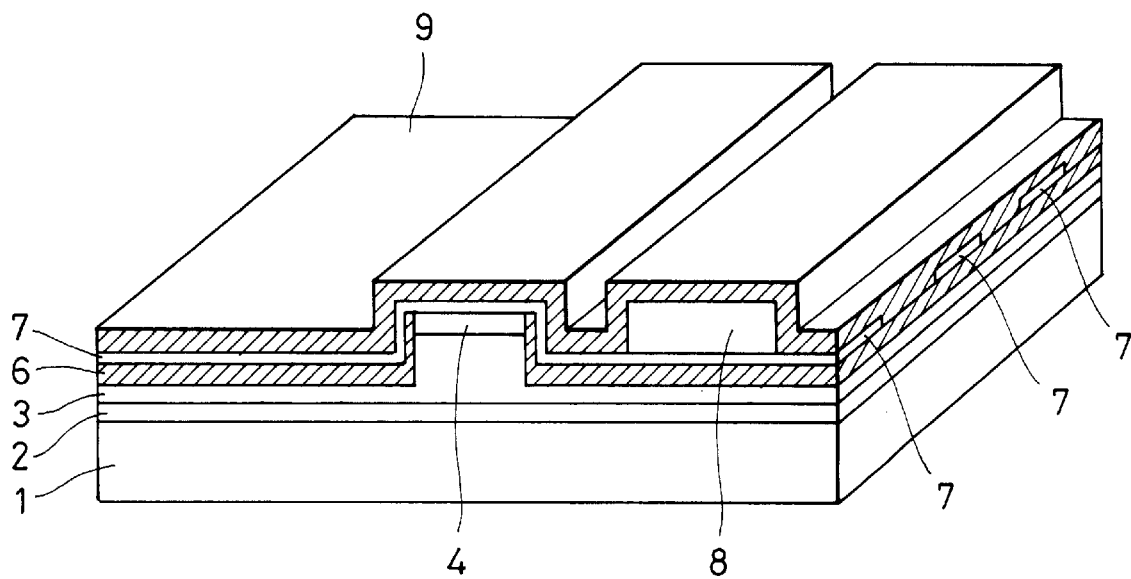

Then, a resist 8 having a stripe pattern is formed on the flat portions except the ridge portion by a photolithography method, which intersects the metal strips 7. An insulating layer 9 of $SiO_2$ is, then, deposited over the entire surface by, for example, a sputtering method as shown in FIG. 10.

Figure 11:
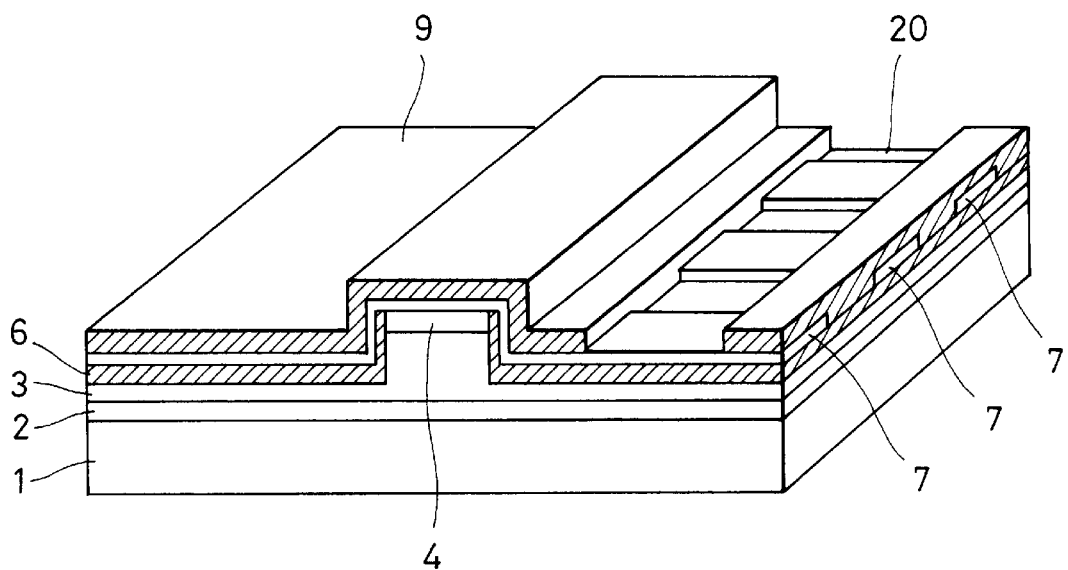
Figure 12:
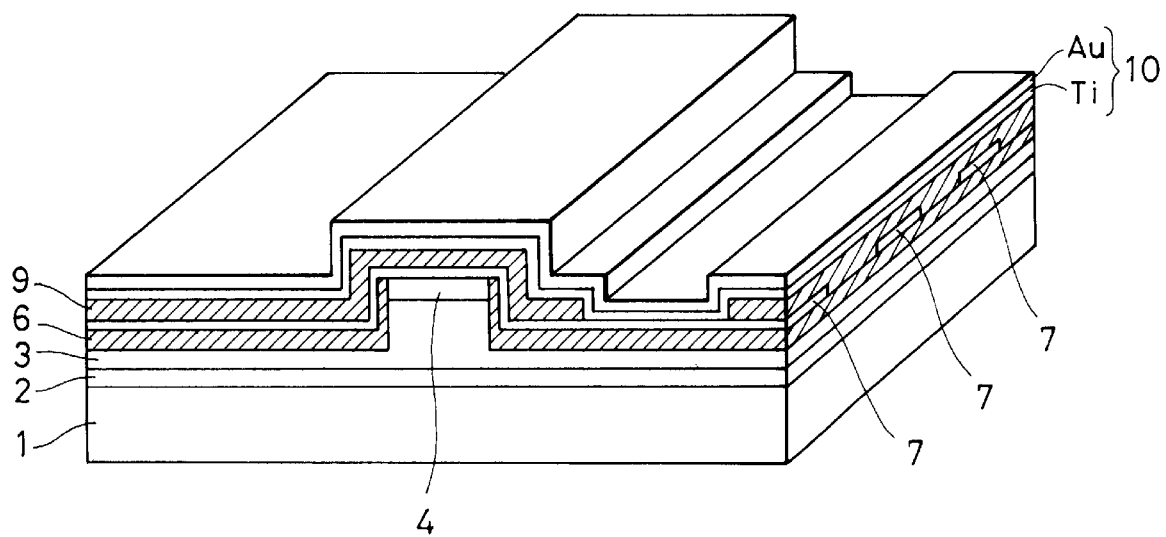
Figure 13:
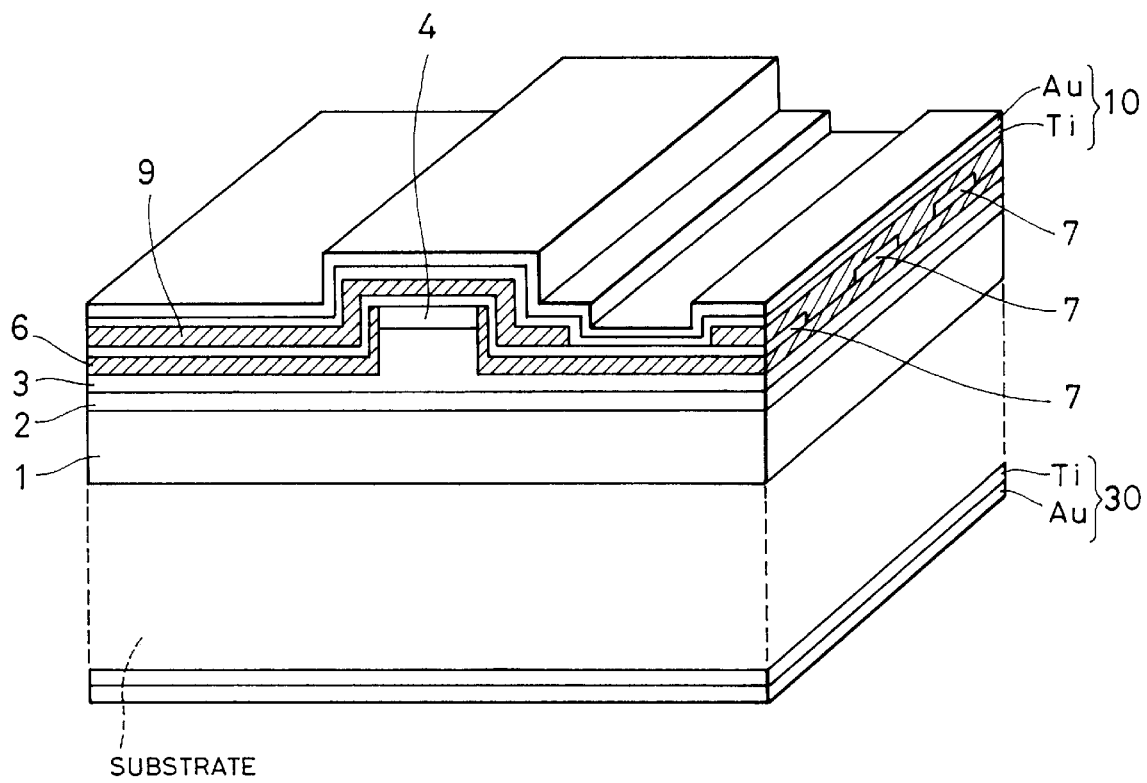

A window 20 for electrode connection is formed by removing the stripe resist 8 by a lift-off method as shown in FIG. 11. Thus, the metal strips 7 are partially exposed on the flat portion. A Ti/Au metal is evaporated onto the metal strips 7 and the $SiO_2$ insulating layer 9 to form a p-electrode 10 as shown in FIG. 12. Then, the back surface of the substrate is polished and a Ti/Au metal is evaporated onto the surface to form an n-electrode. Thus, the ridge DFB semiconductor device can be manufactured with the procedure as mentioned above.

According to the ridge DFB semiconductor laser of the present invention, there is provided an insulating layer 9 which is formed on a plurality of metal strips 7 as shown in FIG. 12. The metal strips 7 are embedded in the insulating layer 9 on the top of the ridge.

Further, in the ridge DFB semiconductor laser of the present invention, the p-electrode is configured as a bus electrode. More particularly, the p-electrode 10 is electrically connected to the plurality of metal strips 7 which serve as the bus electrode. For this purpose, a contact window 20 is provided in the insulating layer 9 and a metal layer of Ti/Au is evaporated thereupon. The insulating layer 9 has a sufficient thickness in order to avoid an optical absorption loss by the Ti/Au p-electrode 10. A current supplied to the p-electrode 10 is injected to the active layer of the laser via the metal strips 7, thereby causing laser oscillation.

As mentioned above, the optical loss due to absorption by the metal electrode can be avoided while a effect of the DFB grating is maintained, since the insulating layer 9, which is transparent to the emitted light, is provided on the metal strips 7. In addition, an electrical contact failure is not likely to occur even though the metal strips 7 are formed thin, since the metal strips 7 are embedded in the insulating material.

For example, thickness of the metal strips 7 is preferably, but not limited to, less than 30 nm. The thickness can be optimized in consideration of the optical absorption loss and various device parameters such as a coupling coefficient of the optical field with the grating, a cavity length and facet reflectivities.

What is claimed is:

1. A ridge-structure DFB semiconductor laser, comprising:

a ridge protruding from flat portions of cladding layer formed on an active layer, said ridge includes an upper cladding layer and a contact layer sequentially formed on said active layer;

a plurality of metal strips having a predetermined periodicity along a longitudinal direction of said ridge and extending from a surface of at least one of said flat portions to a top of said ridge; and an insulating layer formed on said plurality of metal strips at the top of said ridge.

2. A ridge-structure DFB semiconductor laser according to claim 1, further comprises:

an electrode electrically connected to said plurality of metal strips.

3. A ridge-structure DFB semiconductor laser according to claim 2, wherein said electrode is only formed on said at least one of said flat portions.

4. A ridge-structure DFB semiconductor laser according to claim 2, wherein said electrode is formed on said insulating layer so as to extend from the top of said ridge to said plurality of metal strips on said at least one of said flat portions.

5. A ridge-structure DFB semiconductor laser according to claim 1, wherein said active layer is an $In_{1-x}Ga_xAs_{1-y}P_y$ ($0 \leq x \leq 1$, $0 \leq y \leq 1$) bulk layer, said cladding layer is an InP layer, and said contact layer is an $In_{1-x}Ga_xAs_{1-y}P_y$ ($0 \leq x \leq 1$, $0 \leq y \leq 1$) layer.

6. A ridge-structure DFB semiconductor laser according to claim 1, wherein said active layer includes at least one of $In_{1-x}Ga_xAs_{1-y}P_y$ ($0 \leq x \leq 1$, $0 \leq y \leq 1$) quantum-well layers, said cladding layer is an InP layer, and said contact layer is an $In_{1-x}Ga_xAs_{1-y}P_y$ ($0 \leq x \leq 1$, $0 \leq y \leq 1$) layer.

7. A ridge-structure DFB semiconductor laser according to claim 1, wherein said active layer is an $In_{1-x}Ga_xAs_{1-y}P_y$ ($0 \leq x \leq 1$, $0 \leq y \leq 1$) bulk layer, said cladding layer is an InP layer, and said contact layer is an $In_{1-x}Ga_xAs_{1-y}$ ($0 \leq x \leq 1$) layer.

8. A ridge-structure DFB semiconductor laser according to claim 1, wherein said active layer includes at least one of $In_{1-x}Ga_xAs_{1-y}P_y$ ($0 \leq x \leq 1$, $0 \leq y \leq 1$) quantum-well layers, and said contact layer is an $In_{1-x}Ga_xAs$ ($0 \leq x \leq 1$) layer.

* * * * *